United States Patent [19]

Gudger

[11] 4,400,799
[45] Aug. 23, 1983

[54] NON-VOLATILE MEMORY CELL

[75] Inventor: Keith H. Gudger, San Jose, Calif.

[73] Assignee: Intel Corporation, Santa Clara, Calif.

[21] Appl. No.: 300,000

[22] Filed: Sep. 8, 1981

[51] Int. Cl.³ ............................................. G11C 11/40
[52] U.S. Cl. ..................................... 365/95; 365/154; 365/185; 365/228
[58] Field of Search .................. 365/95, 154, 184, 185, 365/189, 228, 230; 307/238.3

[56] References Cited

U.S. PATENT DOCUMENTS

| | | | |
|---|---|---|---|
| 4,207,615 | 6/1980 | Mar | 365/95 |
| 4,337,522 | 6/1982 | Stewart | 365/228 |
| 4,363,110 | 12/1982 | Kauter et al. | 365/228 |
| 4,366,560 | 12/1982 | McDermott et al. | 307/238.3 |

*Primary Examiner*—James W. Moffitt
*Attorney, Agent, or Firm*—Blakely, Sokoloff, Taylor & Zafman

[57] ABSTRACT

A nonvolatile memory cell employing a bistable RAM cell and an electrically erasable and electrically programmable ($E^2$) floating gate memory device. The $E^2$ cell is coupled between one of the input/output nodes of the RAM cell and a clear/recall line. The loads of the RAM cell are imbalanced, causing this cell to assume a predetermined state. If the $E^2$ cell is in its erased state after a storage cycle, the potential on the store/recall line causes the RAM cell to assume its other stable state on recall.

13 Claims, 3 Drawing Figures

NON-VOLATILE MEMORY CELL

BACKGROUND OF THE INVENTION

1. Field of the Invention

The invention relates to the field of nonvolatile memory cells, particularly those employing MOS technology.

2. Prior Art

Most semiconductor memories and in particular, random-access memories (RAMs) require power to retain the information stored in them. When power is lost, data can be permanently lost since in some systems, certain data is stored only in these volatile memories. Because of this, numerous memories have been proposed (and some commercialized) which provide nonvolatile storage.

In some of these semiconductor memories two memory arrays are utilized, one is an ordinary RAM array and the other an electrically erasable and electrically programmable ($E^2$) memory array. When power fails, the information from the RAM array is transferred into the programmable cells of the $E^2$ array.

In another class of semiconductor nonvolatile memories, nonvolatile storage means are incorporated into each of the RAM memory cells. See the prior art discussion in U.S. Pat. No. 4,207,615.

The present invention is a unique coupling of a RAM cell and $E^2$ memory cell. The closest prior art known to Applicant is that shown in U.S. Pat. Nos. 4,207,615 and 4,132,904. Unlike the present invention the cells of these references employ $E^2$ devices across loads or switching transistors of static RAM cells.

SUMMARY OF THE INVENTION

A nonvolatile memory cell is described. The cell includes a bistable (static) memory cell having at least one input/output node. Coupled to this cell are means for causing the cell to assume a first stable state when power is applied to the cell. An electrically programmable and electrically erasable ($E^2$) memory cell has one of its terminals coupled to the node of the bistable memory cell and its other terminal coupled to a control line. In the presently preferred embodiment, the $E^2$ memory cell is a floating gate device having a thin oxide region through which charge is tunneled into and from the floating gate. The control line is used for controlling the clearing of the $E^2$ cell and also to recall information from the $E^2$ cell. When the information is recalled from the $E^2$ cell with the $E^2$ cell storing a binary one (floating gate erased), the bistable cell assumes its second stable state. Otherwise, the bistable cell assumes its first state and is not influenced by the $E^2$ cell.

DETAILED DESCRIPTION OF THE INVENTION

A nonvolatile memory cell is described which includes the combination of a static random-access memory (RAM) cell and an electrically programmable and electrically erasable ($E^2$) memory cell. In the following description, numerous specific details are set forth in order to provide a thorough understanding of the present invention. It will be obvious, however, to one skilled in the art that the present invention may be practiced without these specific details. In other instances, well-known devices and circuits, particularly those used in conjunction with the memory cell of FIG. 1, are not set forth in detail in order not to obscure the present invention in unnecessary detail.

The invented nonvolatile memory cell in its presently preferred embodiment is fabricated employing metal-oxide-semiconductor (MOS) technology. More specifically, n-channel, field-effect devices having polysilicon gates are employed.

Figure 1:
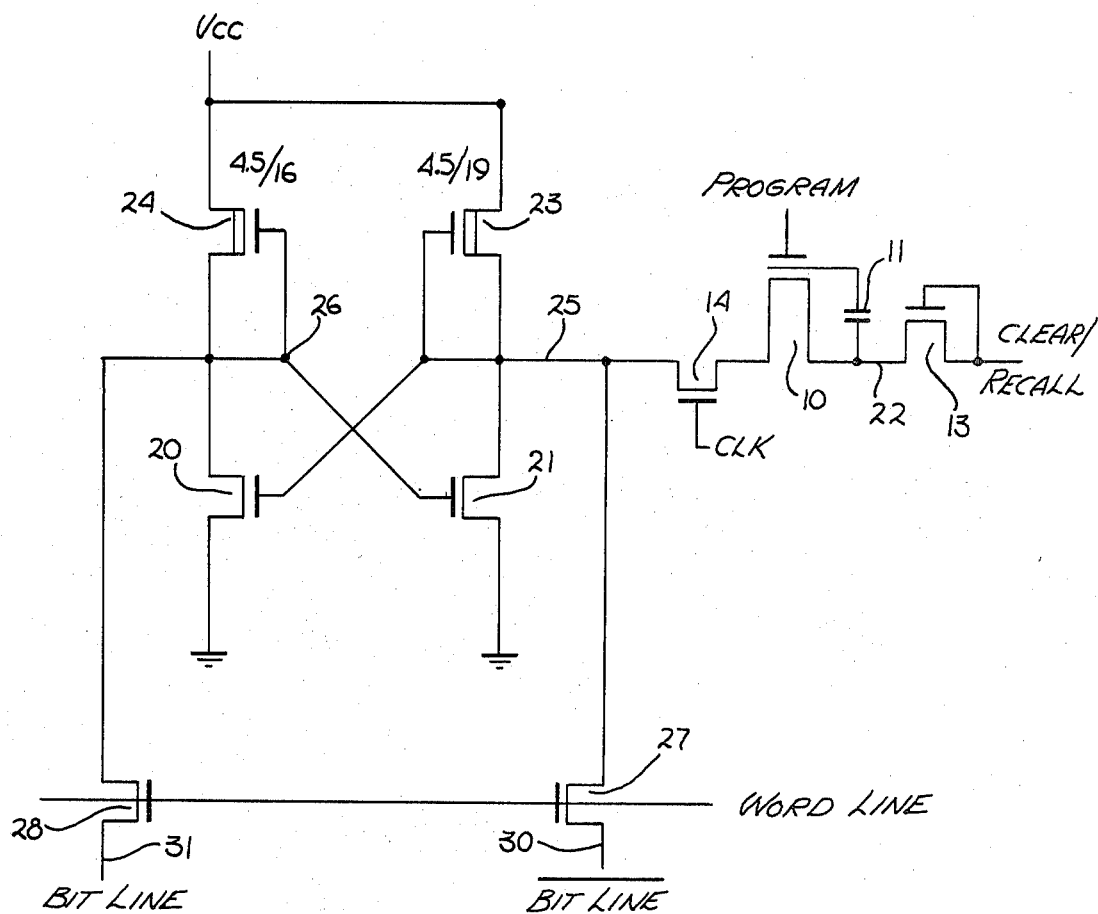
FIG. 1 is an electrical schematic of the presently preferred embodiment of the invention.

Referring now to FIG. 1, the RAM cell employed in the nonvolatile memory cell comprises a bistable (flip-flop) circuit. This cell includes the depletion mode transistor 24 which is coupled in series with the enhancement mode transistor 20. Similarly, the depletion mode transistor 23 is coupled in series with the enhancement mode transistor 21. Transistor 20 is cross-coupled at node 25, and likewise, transistor 21 is cross-coupled through node 26. As is typical, transistors 23 and 24 act as load devices. The nodes 25 and 26 are input/output nodes and are coupled to complementary bit lines 30 and 31, respectively, through the enhancement mode transistors 27 and 28, respectively. The gates of the transistors 27 and 28 are coupled to a word line in the memory. For the n-channel devices used in the presently preferred embodiment, $V_{cc}$ is equal to 5 volts.

The RAM cell of FIG. 1 is an ordinary bistable circuit except that one of its loads is more conductive than the other. This is accomplished by making one of the load transistors larger than the other. In the presently preferred embodiment, transistor 24 is approximately 20% larger than transistor 23. This does not substantially affect the operation of the cell when the cell is operated as an ordinary bistable memory cell. However, when power is applied to this cell, ignoring for the present the influence of the circuit shown to the right of node 25, node 26 is more quickly pulled to $V_{cc}$ than node 25 since transistor 24 is more conductive. This sets the bistable circuit with node 26 high and node 25 low.

The $E^2$ memory cell used in the presently preferred embodiment includes a floating gate in which charge is stored. The charge (or lack of it) in this floating gate determines the conductivity between the terminals of this $E^2$ cell. Charge is transferred into and from the floating gate through a thin oxide region 11. The transfer of charge into and from the floating gate is controlled by the application of a high potential (approximately 20 volts) to the programming gate to program the device, and to node 22 to erase the device. When the $E^2$ cell is programmed, the floating gate is negatively charged and the cell does not conduct when a potential $V_{ref}$ is applied to the programming gate. When the floating gate is erased (slightly positively charged) the cell conducts when the $V_{ref}$ potential is applied to the programming gate. The specific $E^2$ cell used in the presently preferred embodiment is described in U.S. Pat. No. 4,203,158.

One terminal of the $E^2$ cell 10 is coupled to the node 25 through an ordinary enhancement mode transistor 14. The gate of this transistor is coupled to receive a clocking signal. The other terminal of the $E^2$ cell (node 22) is coupled to a clear/recall line through an enhancement mode transistor 13. The potential applied to the clear/recall line controls the clearing of the $E^2$ cell and the recalling of the binary state stored in this cell for purposes of re-establishing data in the RAM cell.

Figure 2:
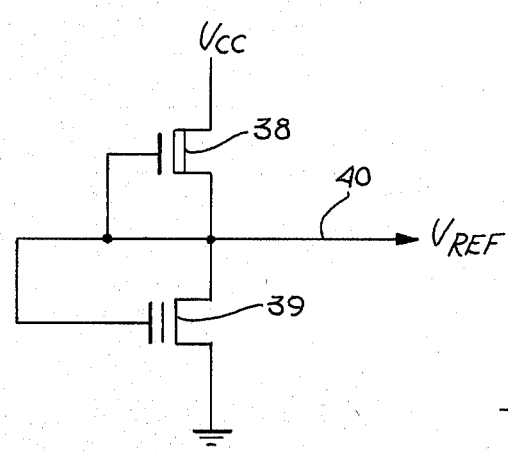
FIG. 2 is an electrical schematic of a circuit used to generate the $V_{ref}$ signal used in the circuit of FIG. 1.

As mentioned, when it is necessary to determine if the floating gate of the $E^2$ is programmed or erased, a potential $V_{ref}$ is applied to the programming gate. This potential is generated with the circuit shown in FIG. 2. This circuit comprises a depletion mode transistor 38 coupled in series with a "dummy" $E^2$ cell 39. The cell 39 is identical to the cell 10 except that it does not have a thin oxide region 11. Thus, the floating gate of cell 39 is always erased. The potential between transistor 38 and cell 39 (line 40) is the $V_{ref}$ signal. Since cells 10 and 39 are fabricated on the same substrate, they have the same characteristics, and particularly the same threshold voltage. $V_{ref}$ varies with process variations so as to compensate for variation in the threshold voltage characteristics of cell 10. As presently preferred, an array of the nonvolatile cells of FIG. 1 is fabricated on a single substrate along with other well-known memory circuits, such as decoders, sense amplifiers, address buffers and input/output buffers. Included on this substrate is a circuit for generating the higher programming potential required to program and erase the $E^2$ cells (approximately 20 volts). The substrate also includes timing circuits for generating the waveforms required to store data from the RAM cells into the $E^2$ cells, and to recall the data from the $E^2$ cells back to the RAM cells. These timing signals are described in FIG. 3 and are generated with well-known circuitry. As presently implemented, each time power is applied to the nonvolatile memory, the memory automatically recalls the data stored in the $E_2$ cells.

Circuitry external to the memory is used to detect a power failure. Typically, after a power failure $V_{cc}$ remains at 5 volts for sufficient time to transfer data from the RAM cells to the $E^2$ cells because of the large capacitance associated with power supplies. The memory also includes a circuit for ignoring all inputs to it once $V_{cc}$ falls below 4 volts.

Figure 3:
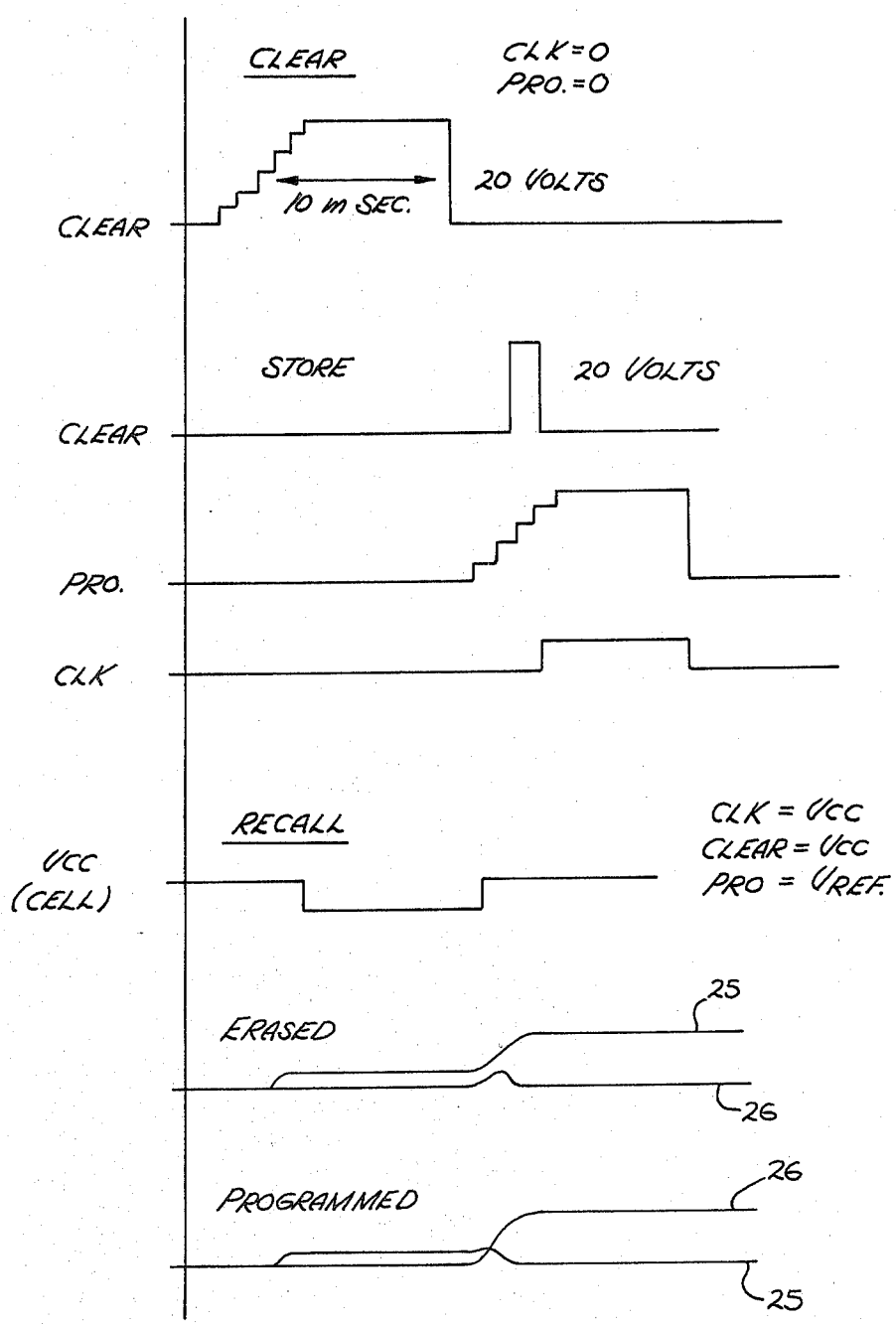
FIG. 3 is a series of waveforms used to explain the operation of the circuit of FIG. 1.

Assume that the memory is in operation and that a power failure occurs. A signal is sent to the memory indicating that a power failure has occurred. As presently implemented, first the $E^2$ cells 10 are cleared. (The $E^2$ cells could be cleared anytime after a recall and thus need not necessarily be cleared immediately after power failures.) To clear (same as erase) the clock signal (gate of transistor 14) is at zero volts as is the programming gate of the $E^2$ cell. The waveform shown under the heading "Clear" of FIG. 3 is applied to the clear/recall line. This waveform passes through transistor 13 to node 22. The high positive potential on node 22 causes all the negative charge (if any) to be removed from the floating gate of the E2 cell 10.

Now a store cycle begins. The clear/recall line is first brought to 20 volts to charge node 22 to approximately 18 volts, then the ramped programming potential is applied to the gate of the $E^2$ cell 10 and a five volt potential is applied to the gate of transistor 14. The waveforms and timing are shown in FIG. 3 under the heading "Store". (Alternately, the clear and programming potentials can be repeatedly applied without ramping the programming signal to charge node 22.)

Assume first that node 25 is high when the state of the RAM cell is being stored. The high potential on node 25 prevents the dissipation of the charge previously stored on node 22. The programming potential on the gate of the $E^2$ PROM device does not cause charge to be transferred to the floating gate since there is not a sufficient differential in potential between the programming gate and the potential on node 22. Thus, if node 25 is high the floating gate of Cell 11 remains uncharged (erased).

When the data is recalled the waveforms shown under the heading "Recall" of FIG. 3 occur. The clear/recall line is held at $V_{cc}$, the programming gate of the cell 10 at $V_{ref}$, and the clocking signal at $V_{cc}$. The $V_{cc}$ potential applied to the RAM cell is dropped to 0 and then brought up to $V_{cc}$. As mentioned, node 26 tends to rise faster than node 25. However, in this instance since the $E^2$ cell is conducting, the potential applied to the clear/recall line is transferred through transistor 13, cell 10 and transistor 14 to node 25. This potential forces node 25 high, causing transistor 20 to conduct and bringing node 26 low. The waveforms on nodes 25 and 26 are shown under the heading "Erased". Thus, the RAM cell is brought back to the state it was in at the time the data was stored.

If, on the other hand, node 25 is low when the storage occurs, node 22 is brought to ground potential through the cell 10, transistor 14 and transistor 21. When the programming potential is applied to cell 10, there is now a substantial differential in potential between the programming gate and node 22. This causes electrons to tunnel through the thin oxide 11 and negatively charging the floating gate, that is, the gate is programmed. Now when recall occurs (again, after a clear cycle) the cell 10 does not conduct and the positive potential applied to the clear/recall line does not reach node 25. When the $V_{cc}$ potential applied to the RAM cell rises, transistor 24 as mentioned, conducts more heavily bringing node 26 high and forcing node 25 low. Once again the RAM cell is brought back to the state it was in at the time storage occurred.

During normal RAM operation the transistor 14 does not conduct, thereby removing cell 10 from the RAM cell operation.

One of the primary advantages to the abovedescribed cell when compared to the prior art cells, is that it may be readily fabricated employing current MOS technology. The prior art cells using floating gate memory devices in parallel with load devices or across the switching devices of the RAM cells do not lend themselves to economic fabrication with current production processes.

Thus, a nonvolatile memory cell has been described which utilizes a static RAM cell and $E^2$ cells.

I claim:
1. A nonvolatile memory cell comprising:
   a bistable memory cell having at least one input/output node;
   means coupled to said bistable cell for causing said bistable cell to assume a predetermined one of its stable states when power is applied to said cell;
   an electrically programmable and electrically erasable ($E^2$) memory cell having two terminals, one of said terminals being coupled to said input/output node of said bistable cell; and,
   a control line for controlling the clearing of said $E^2$ cell and the recalling of information from said $E^2$ cell, said line being coupled to the other terminal of said $E^2$ cell;
   whereby a memory cell is realized which has the capability to store information in the absence of power.
2. The nonvolatile memory cell defined by claim 1 wherein said bistable cell includes a pair of load devices and wherein said means for causing said bistable cell to assume a predetermined one of its stable states comprises an imbalance between said load devices.

3. The nonvolatile memory cell defined by claim 2 wherein said pair of load devices comprise a pair of depletion mode devices, one of which is larger than the other.

4. The nonvolatile memory cell defined by claim 1 wherein said $E^2$ memory cell comprises a floating gate device having a thin oxide region for transporting charge to and from the floating gate.

5. The nonvolatile memory cell defined by claim 1 wherein a transistor is coupled between said one terminal of said $E^2$ memory cell and said node of said bistable cell.

6. A nonvolatile memory cell comprising:
    a bistable memory cell having at least one input/output node;
    means coupled to said bistable cell for causing said bistable cell to assume a predetermined one of its stable states when power is applied to said cell;
    an electrically programmable and electrically erasable ($E^2$) memory cell including two terminals, a floating gate and a thin oxide region through which charge is tunnelled to and from said floating gate, one of said terminals being coupled to said input/output node of said bistable cell; and,
    a control line for controlling and clearing of said $E^2$ cell and the recalling of information from said $E^2$ cell, said line being coupled to the other terminal of said $E^2$ cell;
    whereby a memory cell is realized which has the capability to store information in the absence of power.

7. The nonvolatile memory cell defined by claim 6 wherein said bistable cell includes a pair of load devices and wherein said means for causing said bistable cell to assume a predetermined one of its stable states comprises an imbalance between said load devices.

8. The nonvolatile memory cell defined by claim 7 wherein said pair of load devices comprise a pair of depletion load devices, one of which is larger than the other.

9. The nonvolatile memory cell defined by claim 8 wherein a transistor is coupled between said one terminal of said $E^2$ memory cell and said node of said bistable cell.

10. A nonvolatile memory cell comprising:
    a bistable memory cell having at least one input/output node and a pair of load devices, one of which is more conductive than the other;
    an electrically programmable and electrically erasable ($E^2$) memory cell having two terminals, one of said terminals being coupled to said input/output node of said bistable cell; and,
    a control line for controlling the clearing of said $E^2$ cell and the recalling of information from said $E^2$ cell, said line being coupled to the other terminal of said $E^2$ cell;
    whereby a memory cell is realized which has the capability to store information in the absence of power.

11. The nonvolatile memory cell defined by claim 10 wherein said pair of load devices comprise a pair of depletion load devices, one of which is larger than the other.

12. The nonvolatile memory cell defined by claim 11 wherein said $E^2$ memory cell comprises a floating gate device having a thin oxide region for transporting charge to and from the floating gate.

13. The nonvolatile memory cell defined by claim 12 wherein a transistor is coupled between said one terminal of said $E^2$ memory cell and said node of said bistable cell.

* * * * *